(12) United States Patent
Wang

(10) Patent No.: US 12,132,053 B2
(45) Date of Patent: Oct. 29, 2024

(54) DISPLAY DEVICE AND METHOD OF MANUFACTURING THE SAME

(71) Applicant: Shenzhen China Star Optoelectronics Semiconductor Display Technology Co., Ltd., Guangdong (CN)

(72) Inventor: Haijun Wang, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 17/419,115

(22) PCT Filed: May 28, 2021

(86) PCT No.: PCT/CN2021/096612
§ 371 (c)(1),
(2) Date: Jun. 28, 2021

(87) PCT Pub. No.: WO2022/213463
PCT Pub. Date: Oct. 13, 2022

(65) Prior Publication Data
US 2024/0030224 A1    Jan. 25, 2024

(30) Foreign Application Priority Data

Apr. 8, 2021 (CN) .......................... 202110375867.5

(51) Int. Cl.
*H01L 27/12* (2006.01)
*G02F 1/1368* (2006.01)

(52) U.S. Cl.
CPC ........ *H01L 27/1225* (2013.01); *G02F 1/1368* (2013.01); *H01L 27/127* (2013.01)

(58) Field of Classification Search
CPC .. H01L 27/1225; H01L 27/127; G02F 1/1368
See application file for complete search history.

(56) References Cited

U.S. PATENT DOCUMENTS

| 2005/0220391 A1 | 10/2005 | Hashimoto |
| 2006/0270238 A1 | 11/2006 | Izumi |
| 2009/0134534 A1 | 5/2009 | Koivukunnas |

(Continued)

FOREIGN PATENT DOCUMENTS

| CN | 104679356 A | 6/2015 |
| CN | 108780797 A | 11/2018 |

(Continued)

*Primary Examiner* — Benjamin Tzu-Hung Liu

(57) ABSTRACT

A display device and a method of manufacturing the same are disclosed. The display device includes a substrate layer and an active layer. The active layer includes a first body portion, a second body portion, and an additional portion. The first body portion is disposed on the first substrate area, the additional portion is disposed on the first body portion, the second body portion is arranged on the second substrate area, and the first body portion and the additional portion are not connected to the second body portion, wherein a band gap of the additional portion is smaller than a band gap of the first body portion and a band gap the second body portion.

20 Claims, 8 Drawing Sheets

(56) References Cited

U.S. PATENT DOCUMENTS

2011/0272689 A1* 11/2011 Park .................... G02F 1/13338
                                                        438/57
2016/0126381 A1    5/2016 Wang
2021/0193753 A1*  6/2021 Kim .................. H01L 31/03682
2022/0359619 A1* 11/2022 Wang .................... H10K 39/30

FOREIGN PATENT DOCUMENTS

| | | |
|---|---|---|
| CN | 111048524 A | 4/2020 |
| CN | 111399292 A | 7/2020 |
| CN | 111463252 A | 7/2020 |
| CN | 112071865 A | 12/2020 |
| CN | 112086561 A | 12/2020 |
| JP | 2007152554 A | 6/2007 |

* cited by examiner

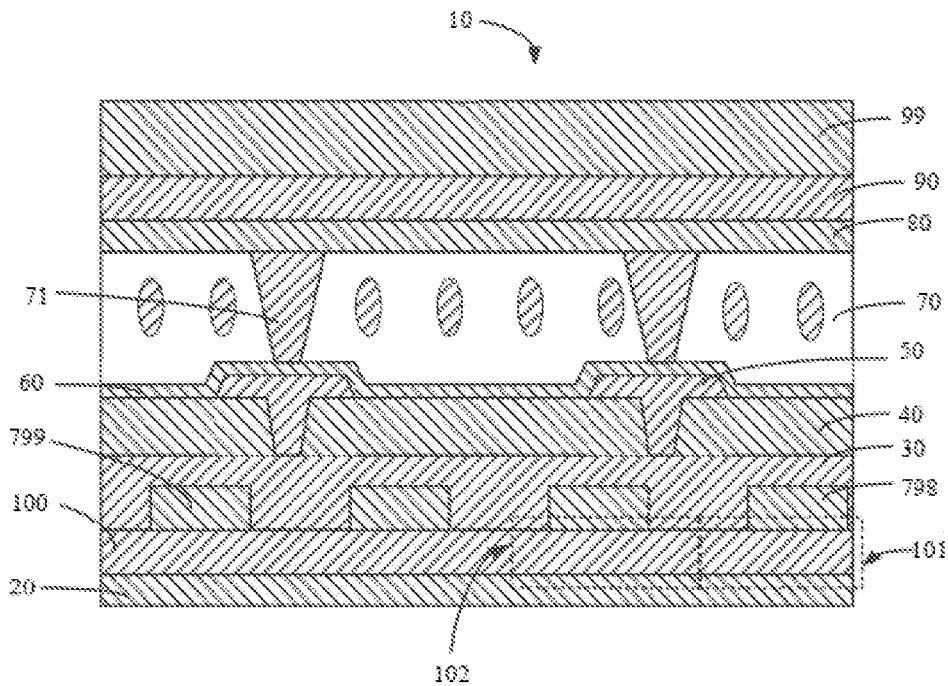

FIG. 6 providing a substrate layer, wherein the substrate layer includes a first substrate area and a second substrate area adjacent to the first substrate area — B11 forming an active layer on the substrate layer, wherein the active layer includes a first body portion, a second body portion, and an additional portion, the first body portion is disposed in the first substrate area, the additional portion is disposed on the first body portion, the second body portion is disposed in the second substrate area, the first body portion and the additional portion are not connected with the second body portion, and a band gap of the additional portion is smaller than a band gap of the first body portion and a band gap of the second body portion — B12

FIG. 7

DISPLAY DEVICE AND METHOD OF MANUFACTURING THE SAME

FIELD OF INVENTION

The present application relates to the field of display technologies, and in particular to a display device and a method of manufacturing the same.

BACKGROUND OF INVENTION

At present, in order to achieve the effect of laser control of a display device, a photosensitive transistor with a sensing function and a display transistor with a display function are usually manufactured on a substrate by the same process and manufacturing process. However, since an active layer formed by the photosensitive transistor and the display transistor manufactured by the same process can only be the same kind of active layer, both a high photosensitive function required by the photosensitive transistor and a high mobility function required by the display transistor cannot be achieved at the same time.

For example, the commonly used materials for active layers includes amorphous silicon, indium gallium zinc oxide, and polysilicon. Although an active layer formed of amorphous silicon has a satisfying photosensitive effect, i.e., generating high signal strength as receiving laser irradiation, a mobility is relatively low. That is, the corresponding display transistor cannot meet a requirement of a large display with a high refresh rate. Although an active layer formed of indium gallium zinc oxide has a high mobility and can be widely used in a large display with a high refresh rate, it generates weak signal strength as receives laser irradiation.

Therefore, there is an urgent need for a display device with high signal intensity generated by photosensitization.

SUMMARY OF INVENTION

Technical Problems

An embodiment of the present disclosure provides a display device and a method of manufacturing the same, so as to solve a problem of weak signal intensity generated by photosensitization of a display device in the prior art.

Technical Solutions

The present disclosure provides a display device, comprising: a substrate layer, including a first substrate area and a second substrate area adjacent to the first substrate area; a gate layer disposed on the substrate layer, wherein the gate layer includes a first gate portion and a second gate portion, the first gate portion is located on the first substrate area, and the second gate portion is located on the second substrate area; and an active layer including a first body portion, a second body portion, and an additional portion, wherein the first body portion is disposed in the first substrate area and on the first gate portion, the additional portion is disposed on the first body portion, the second body portion is disposed in the second substrate area and on the second gate portion, the first body portion and the additional portion are not connected with the second body portion, and a band gap of the additional portion is smaller than a band gap of the first body portion and a band gap of the second body portion.

Optionally, in some embodiments of the present disclosure, the additional portion includes a plurality of first additional sub-portions, and each adjacent two of the first additional sub-portions are not connected with each other.

Optionally, in some embodiments of the present disclosure, the additional portion further includes a second additional sub-portion, the second additional sub-portion is disposed on the first body portion, and the plurality of first additional sub-portions are disposed on the second additional sub-portion.

Optionally, in some embodiments of the present disclosure, a surface of each of the first additional sub-portions defines a first microstructure.

Optionally, in some embodiments of the present disclosure, the additional portion includes a plurality of first additional sub-portions, the first body portion includes a first active area and a second active area disposed around the first active area, and the plurality of first additional sub-portions are disposed in the second active area.

Optionally, in some embodiments of the present disclosure, additional portion includes a plurality of first additional sub-portions, the first body portion includes a first active area and a second active area disposed around the first active area, the first additional sub-portions are disposed in the first active area and the second active area, and a thickness of the first additional sub-portion in the second active area is greater than a thickness of the first additional sub-portion in the first active area.

Optionally, in some embodiments of the present disclosure, the display device further comprises a first insulating layer, and the first insulating layer covers the substrate layer and the gate layer.

An embodiment of the present disclosure further provides a display device, comprising: a substrate layer including a first substrate area and a second substrate area adjacent to the first substrate area; and an active layer including a first body portion, a second body portion, and an additional portion, wherein the first body portion is disposed in the first substrate area, the additional portion is disposed on the first body portion, the second body portion is disposed in the second substrate area, the first body portion and the additional portion are not connected with the second body portion, and a band gap of the additional portion is smaller than a band gap of the first body portion and a band gap of the second body portion.

Optionally, in some embodiments of the present disclosure, the additional portion includes a plurality of first additional sub-portions, and each adjacent two of the first additional sub-portions are not connected with each other.

Optionally, in some embodiments of the present disclosure, the additional portion further includes a second additional sub-portion, the second additional sub-portion is disposed on the first body portion, and the plurality of first additional sub-portions are disposed on the second additional sub-portion.

Optionally, in some embodiments of the present disclosure, a surface of each of the first additional sub-portions defines a first microstructure.

Optionally, in some embodiments of the present disclosure, the additional portion includes a plurality of first additional sub-portions, the first body portion includes a first active area and a second active area disposed around the first active area, and the plurality of first additional sub-portions are disposed in the second active area.

Optionally, in some embodiments of the present disclosure, the additional portion includes a plurality of first additional sub-portions, the first body portion includes a first active area and a second active area disposed around the first active area, the plurality of first additional sub-portions are disposed in the first active area and the second active area, and a thickness of the first additional sub-portion in the second active area is greater than a thickness of the first additional sub-portion in the first active area.

Optionally, in some embodiments of the present disclosure, the display device further comprises a first insulating layer, and the first insulating layer covers the substrate layer and the gate layer.

Correspondingly, a method of manufacturing a display device, comprising steps of: providing a substrate layer, wherein the substrate layer includes a first substrate area and a second substrate area adjacent to the first substrate area; and forming an active layer on the substrate layer, wherein the active layer includes a first body portion, a second body portion, and an additional portion, the first body portion is disposed in the first substrate area, the additional portion is disposed on the first body portion, the second body portion is disposed in the second substrate area, the first body portion and the additional portion are not connected with the second body portion, and a band gap of the additional portion is smaller than a band gap of the first body portion and a band gap of the second body portion.

Optionally, in some embodiments of the present disclosure, in the step of forming the active layer on the substrate layer includes steps of: forming a first protective layer on the substrate layer and the second body portion; providing an additional portion material on the first body portion; forming a second protective layer on the additional portion material on the first body portion; and etching the additional portion material to form an additional portion.

Optionally, in some embodiments of the present disclosure, in the step of etching the additional portion material to form the additional portion includes removing the second protective layer.

Optionally, in some embodiments of the present disclosure, after the step of removing the second protective layer, the method further includes a step of etching the additional portion to form an additional portion including a plurality of first additional sub-portions and a second additional sub-portion, wherein the second additional sub-portion is disposed on the first body portion, and the plurality of first additional sub-portions are disposed on the second additional sub-portion.

Optionally, in some embodiments of the present disclosure, after the step of providing the substrate layer including the first substrate area and the second substrate area adjacent to the first substrate area, before the step of forming the active layer on the substrate layer, the method further comprises a step of forming a gate layer on the substrate layer, wherein the gate layer includes a first gate portion and a second gate portion, the first gate portion is located in the first substrate area, and the second gate portion is located in the second substrate area.

Optionally, in some embodiments of the present disclosure, a distance between each adjacent two of the first additional sub-portions ranges from 1 nanometer to 5000 nanometers.

Beneficial Effect:

The embodiment of the present disclosure discloses the display device and the method of manufacturing the same. The display device includes the substrate layer and the active layer. The substrate layer includes the first substrate area and the second substrate area adjacent to the first substrate area. The active layer includes the first body portion, the second body portion, and the additional portion, wherein the first body portion is disposed on the first substrate area, and the additional portion is disposed on the first body portion, the second body portion is disposed on the second substrate area, the first body portion and the additional portion are not connected to the second body portion, and the band gap of the additional portion is smaller than that of the band gap of the first body portion and that of the second body portion. By providing the additional portion with the band gap smaller than that of the first body portion and that of the second body portion on the first body portion, the band gap of the active layer is reduced, thereby increasing photosensitive performance of the active layer, increasing signal intensity generated by the active layer, and improving performance of the display device.

DESCRIPTION OF DRAWINGS

In order to describe technical solutions in the embodiment of the present disclosure more clearly, attached drawings required for describing the embodiments will be simply explained as below. Apparently, the attached drawings for the following description are only some embodiments of the present disclosure. Those skilled in the art also could derive other attached drawings from these attached drawings without making a creative work.

FIG. 6 is a schematic cross-sectional view of a sixth structure of a display device provided by an embodiment of the present disclosure.

FIG. 7 is a schematic flowchart of a method of manufacturing a display device provided in an embodiment of the present disclosure.

DETAILED DESCRIPTION OF PREFERRED EMBODIMENTS

Figure 1:
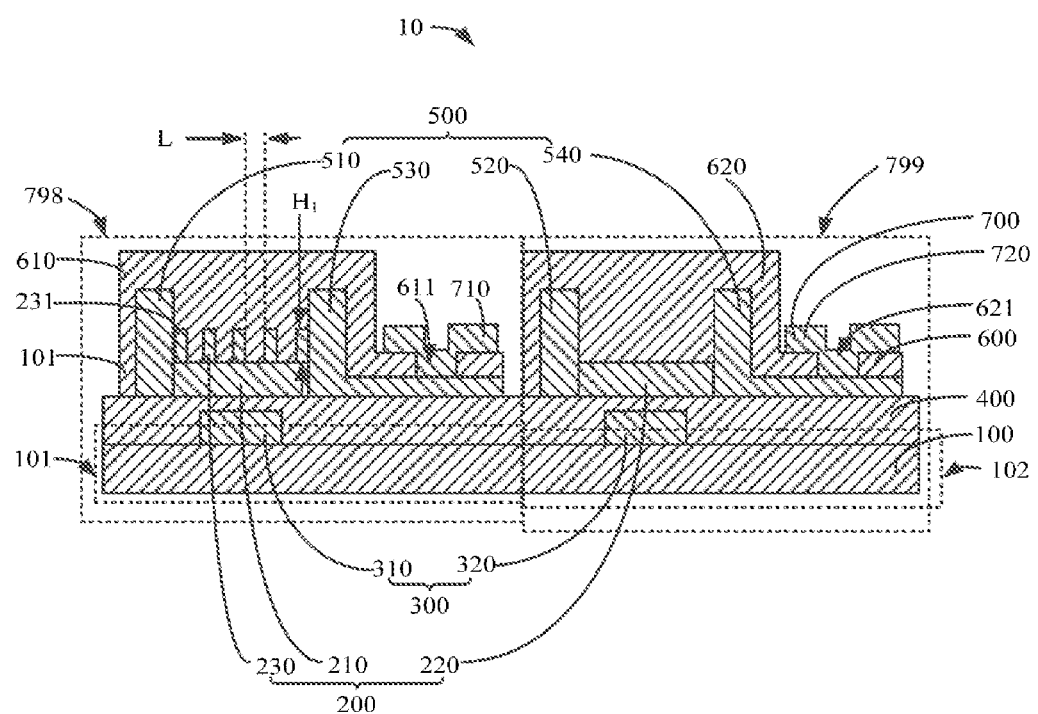
FIG. 1 is a schematic cross-sectional view of a first structure of a display device provided by an embodiment of the present disclosure.

The technical solutions in the embodiments of the present disclosure will be described clearly and completely in combination with the attached drawings in the embodiments of the present disclosure. Obviously, the described embodiments are only part of the embodiments of the present disclosure, not all of them. Based on the embodiments in the present disclosure, all other embodiments obtained by those skilled in the art without creative work shall fall within the protection scope of the present disclosure. In addition, it should be understood that the specific implementations described here are only used to illustrate and explain the present disclosure, and are not used to limit the present disclosure. In present disclosure, unless otherwise stated, the directional terms used such as "upper" and "lower" generally refer to the upper and lower directions of the device in actual use or working state, and specifically refer to the drawing directions in the attached drawings. Moreover, terms of "inner" and "outer" refer to the profile of the device.

Please refer to FIG. 1. FIG. 1 is a schematic cross-sectional view of a first structure of a display device provided by an embodiment of the present disclosure. The embodiment of the present disclosure provides a display device and a method of manufacturing the same. The display device 10 includes a substrate layer 100 and an active layer 200. The specific description is as follows.

The substrate layer 100 includes a first substrate area 101 and a second substrate area 102 adjacent to the first substrate area 101. Material of the substrate layer 100 includes polyimide and the like.

In an embodiment, the display device 10 further includes a gate layer 300. The gate layer 300 is disposed on the substrate layer 100. Material of the gate layer 300 includes one or several combinations of Al, Cu, Ag, Au, Mn, Zn, and Fe. The gate layer 300 includes a first gate portion 310 and a second gate portion 320. The first gate portion 310 is located on the first substrate area 101. The second gate portion 320 is located on the second substrate area 102.

In an embodiment, the display device 10 further includes a first insulating layer 400. The first insulating layer 400 covers the substrate layer 100 and the gate layer 300. Material of the first insulating layer 400 includes one or several combinations of $SiN_x$, $SiO_x$, and $SiO_xN_y$.

The active layer 200 includes a first body portion 210, a second body portion 220, and an additional portion 230. The first body portion 210 is disposed on the first substrate area 101. The additional portion 230 is disposed on the first body portion 210. The second body portion 220 is disposed on the second substrate area 102. The first body portion 210 and the additional portion 230 are not connected to the second body portion 220. A band gap of the additional portion 230 is smaller than a band gap of the first body portion 210 and a band gap the second body portion 220.

Specifically, the first body portion 210 is disposed on the first insulating layer 400 and located on the first gate portion 310. The second body portion 220 is disposed on the first insulating layer 400 and located on the second gate portion 320.

In an embodiment, the band gaps of the first body portion 210 and the second body portion 220 range greater than 3.5 electron volts (eV). The band gap of the additional portion 230 ranges from 1 eV to 3.5 eV.

In an embodiment, materials of the first body portion 210 and the second body portion 220 include indium gallium zinc oxide (IGZO). Material of the additional portion 230 includes one or several combinations of $Hg_{1-x}Cd_xSe$, $Mn_xHg_{1-x}Te$, $Pb_{1-x}Sn_xTe$, $Pb_{1-x}Sn_xSe$, ZnO, and ZnON, where $0 \leq x \leq 1$.

In the present disclosure, the additional portion 230 having a smaller band gap than the first body portion 210 and the second body portion 220 is provided on the first body portion 210. Since the additional portion 230 has a narrow band gap, and the band gap of the additional portion 230 can be adjusted by selecting different materials, the band gap of the active layer 200 is reduced, thereby increasing signal intensity generated during laser irradiation, improving photosensitive performance and mobility, and improving performance of the display device 10.

In an embodiment, the additional portion 230 includes a plurality of first additional sub-portions 231. Each adjacent two of the first additional sub-portions 231 are not connected to each other.

In an embodiment, a distance L between each adjacent two of the first additional sub-portions 231 ranges from 1 nanometer to 5000 nanometers. Specifically, the distance L between each adjacent two of the first additional sub-portions 231 may be 200 nanometers, 1000 nanometers, 2000 nanometers, 3200 nanometers, 4700 nanometers, 4920 nanometers, or the like.

In an embodiment, a thickness $H_1$ of the first additional sub-portion 231 ranges from 1 nanometer to 5000 nanometers. Specifically, the thickness $H_1$ of the first additional sub-portion 231 may be 200 nanometers, 1000 nanometers, 2000 nanometers, 3200 nanometers, 4700 nanometers, 4920 nanometers, or the like.

In an embodiment, the thicknesses $H_1$ of the adjacent first additional sub-portions 231 may not be equal.

In the present disclosure, configuring the additional portion 230 to be several first additional sub-portions 231 facilitates propagation of laser between the first additional sub-portions 231, thereby further improving absorption of laser and further improving signal intensity generated during laser irradiation. That is, photosensitive performance is improved, thereby improving performance of the display device 10.

In an embodiment, the display device 10 further includes a source and drain layer 500. Material of the source and drain layer 500 includes one or several combinations of Al, Cu, Ag, Au, Mn, Zn, and Fe. The source and drain layer 500 includes a first source 510, a second source 520, a first drain 530, and a second drain 540. The first source 510 is disposed on the first insulating layer 400 and located on one side of the first body portion 210 and the additional portion 230. The first drain 530 is disposed on the first insulating layer 400 and located on the other side of the first body portion 210 and the additional portion 230. The second source 520 is disposed on the first insulating layer 400 and located on one side of the second body portion 220. The second drain 540 is disposed on the first insulating layer 400 and located on the other side of the second body portion 220.

In an embodiment, the display device 10 further includes a second insulating layer 600. Material of the second insulating layer 600 includes one or several combinations of $SiN_x$, $SiO_x$, and $SiO_xN_y$. The second insulating layer 600 includes a first insulating portion 610 and a second insulating portion 620. The first insulating portion 610 covers the additional portion 230, the first source 510, and the first drain 530. The first insulating portion 610 includes a first through hole 611. The first through hole 611 penetrates the first insulating portion 610 to expose the first drain 530. The second insulating portion 620 covers the second body portion 220, the second source 520, and the second drain 540. The second insulating portion 620 includes a second through hole 621. The second through hole 621 penetrates the second insulating portion 620 to expose the second drain 540.

In an embodiment, the display device 10 further includes a conductive layer 700. The conductive layer 700 includes a first conductive portion 710 and a second conductive portion 720. The first conductive portion 710 is disposed on the first insulating portion 610 and extends into the first through hole 611 to be electrically connected to the first drain 530. The second conductive portion 720 is disposed on the second insulating portion 620 and extends into the second through hole 621 to be electrically connected to the second drain 540.

The first gate portion 310, the first body portion 210, the additional portion 230, the first source 510, the first drain 530, the first insulating portion 610, and the first conductive portion 710 constitutes a photosensitive transistor 798. The second gate portion 320, the second body portion 220, the second source 520, the second drain 540, the second insulating portion 620, and the second conductive portion 720 constitute a display transistor 799.

In the present disclosure, the additional portion 230 having a smaller band gap than the first body portion 210 is provided on the first body portion 210. Since the band gap of the additional portion 230 is narrow, and the band gap can be adjusted, the overall band gap of the active layer 200 is reduced, thereby increasing signal intensity generated during laser irradiation and further improving performance of the display device 10. Configuring the additional portion 230 to be several first additional sub-portions 231 facilitates propagation of laser between the first additional sub-portions 231, thereby further improving absorption of laser, increasing signal intensity generated during laser irradiation, and increasing performance of the display device 10.

The present disclosure provides a display device 10, and the active layer 200 of the display device 10 is formed with the first body portion 210, the second body portion 220, and the additional portion 230. The first body portion 210 and the second body portion 220 have high mobility, the band gap of the additional portion 230 is narrow, and the band gap is adjustable. Providing the additional portion 230 on the first body portion 210 can reduce the overall band gap of the source layer 200, thereby increasing signal intensity generated during laser irradiation of the display device 10 and further improving performance of the display device 10.

Figure 2:
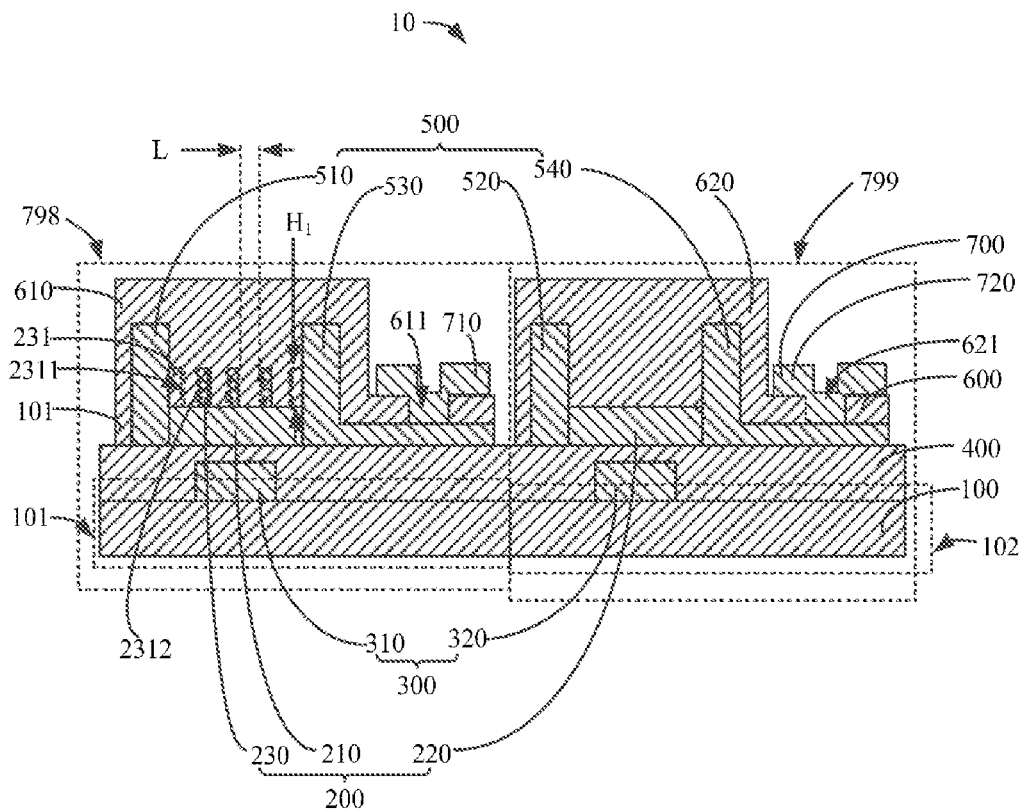
FIG. 2 is a schematic cross-sectional view of a second structure of a display device provided by an embodiment of the present disclosure.

Please refer to FIG. 2. FIG. 2 is a schematic cross-sectional view of a second structure of the display device provided by an embodiment of the present disclosure. It should be noted that the difference between the second structure and the first structure is described as follows.

A surface 2311 of the first additional sub-portion 231 defines a plurality of first microstructures 2312. Each of the first microstructures 2312 is an uneven microstructure.

In an embodiment, a density of the first microstructures 2312 close to the first body portion 210 is greater than a density of the first microstructures 2312 away from the first body portion 210, which further increases residence time of light, thereby improving absorption of light and further improving photosensitive performance of the display device 10.

In the present disclosure, the effect of the first microstructures 2312 is to prolong light transmitting through the first additional sub-portion 231, thereby further improving absorption of light, further improving signal intensity generated during laser irradiation, and improving performance of the display device 10. Defining the density of the first microstructures 2312 close to the first body portion 210 to be greater than the density of the first microstructures 2312 away from the first body portion 210 improves absorption of light, thereby improving signal intensity generated during laser irradiation and improving performance of the display device 10.

Figure 3:
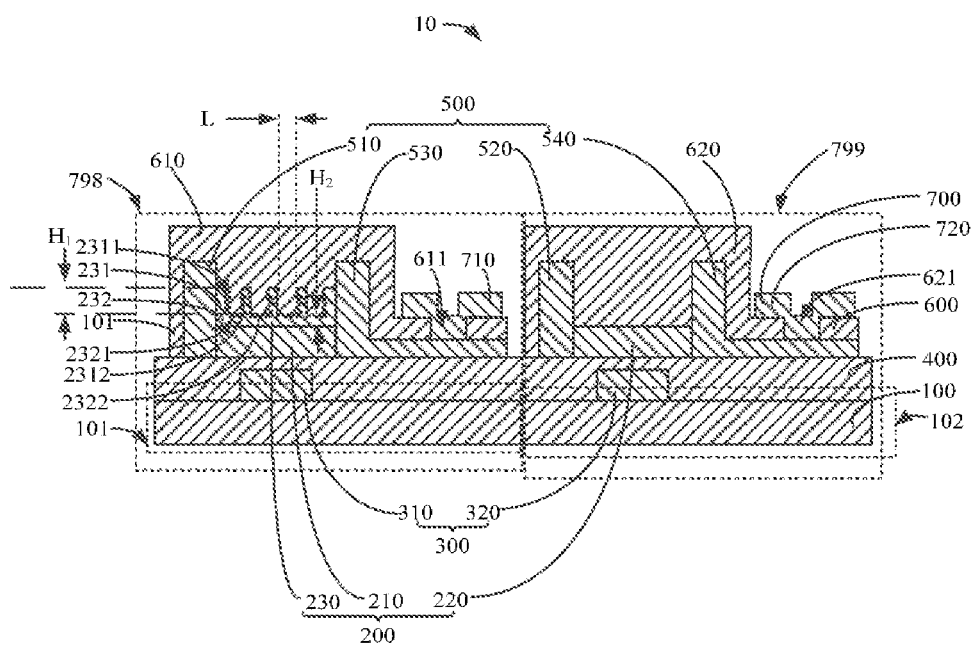
FIG. 3 is a schematic cross-sectional view of a third structure of a display device provided by an embodiment of the present disclosure.

Please refer to FIG. 3. FIG. 3 is a schematic cross-sectional view of a third structure of the display device according to an embodiment of the present disclosure. It should be noted that the difference between the third structure and the second structure is described as follows.

The additional portion 230 further includes a second additional sub-portion 232. The second additional sub-portion 232 is disposed on the first body portion 210. The first additional sub-portion 231 is disposed on the second additional sub-portion 232.

In one embodiment, a thickness $H_2$ of the second additional sub-portion 232 ranges from 1 nanometer to 5000 nanometers. Specifically, the thickness $H_2$ of the second additional sub-portion 232 may be 200 nanometers, 1000 nanometers, 2000 nanometers, 3200 nanometers, 4700 nanometers, 4920 nanometers, or the like.

In an embodiment, a surface 2321 of the second additional sub-portion 232 is provided with a plurality of second microstructures 2322. Each of the second microstructures 2322 is an uneven microstructure. The effect of the second microstructures 2322 is to prolong light transmitting through the second additional sub-portion 231, thereby further improving absorption of light, further improving signal intensity generated during laser irradiation, and improving performance of the display device 10.

In the present disclosure, the second additional sub-portion 232 and the first additional sub-portion 231 are stacked in sequence on the first body portion 210, which is beneficial for laser to propagate between the first additional sub-portion 231 and the second additional sub-portion 232, thereby further improving absorption of laser, further increasing signal intensity generated during laser irradiation, and improving performance of the display device 10. Defining the plurality of second microstructures 2322 on the surface 2321 of the second additional sub-portion 232 further prolongs light transmitting through the second additional sub-portion 232, thereby further improving absorption of laser, further increasing signal intensity generated during laser irradiation, and improving performance of the display device 10.

Figure 4:
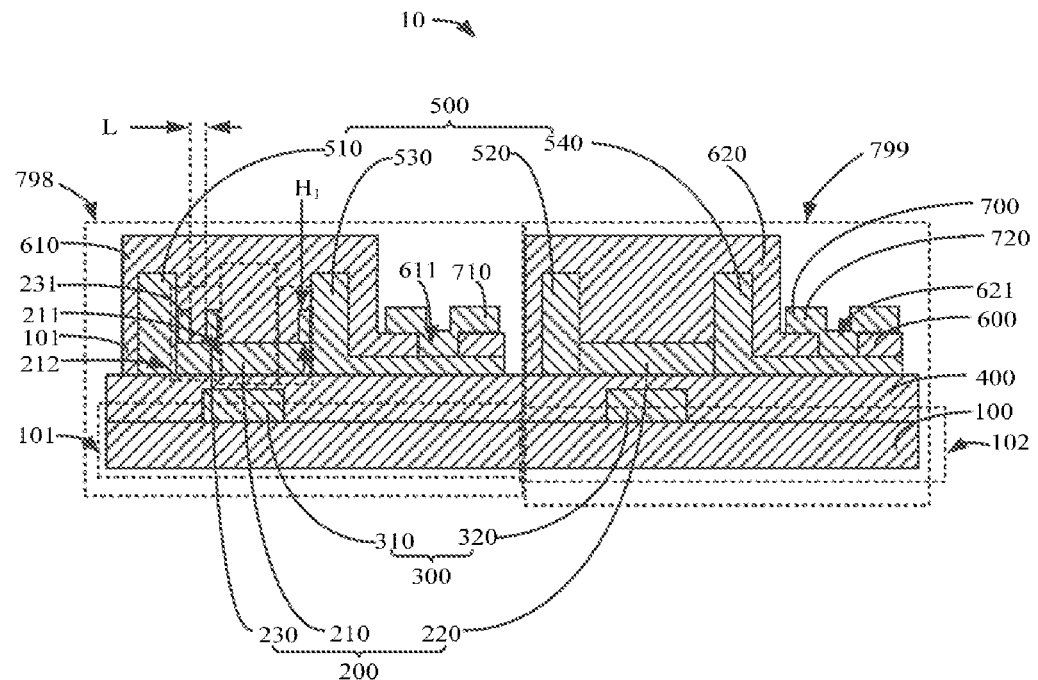
FIG. 4 is a schematic cross-sectional view of a fourth structure of a display device provided by an embodiment of the present disclosure.

Please refer to FIG. 4. FIG. 4 is a schematic cross-sectional view of a fourth structure of the display device provided by an embodiment of the present disclosure. It should be noted that the difference between the fourth structure and the first structure is described as follows.

The first body portion 210 includes a first active area 211 and a second active area 212 disposed around the first active area 211. The first additional sub-portion 231 is disposed in the second active area 212.

The effect of the first additional sub-portion 231 is to prolong light transmitting through the first additional sub-portion 231, thereby further improving absorption of light, further increasing signal intensity generated during laser irradiation, and increasing performance of the display device 10.

Figure 5:
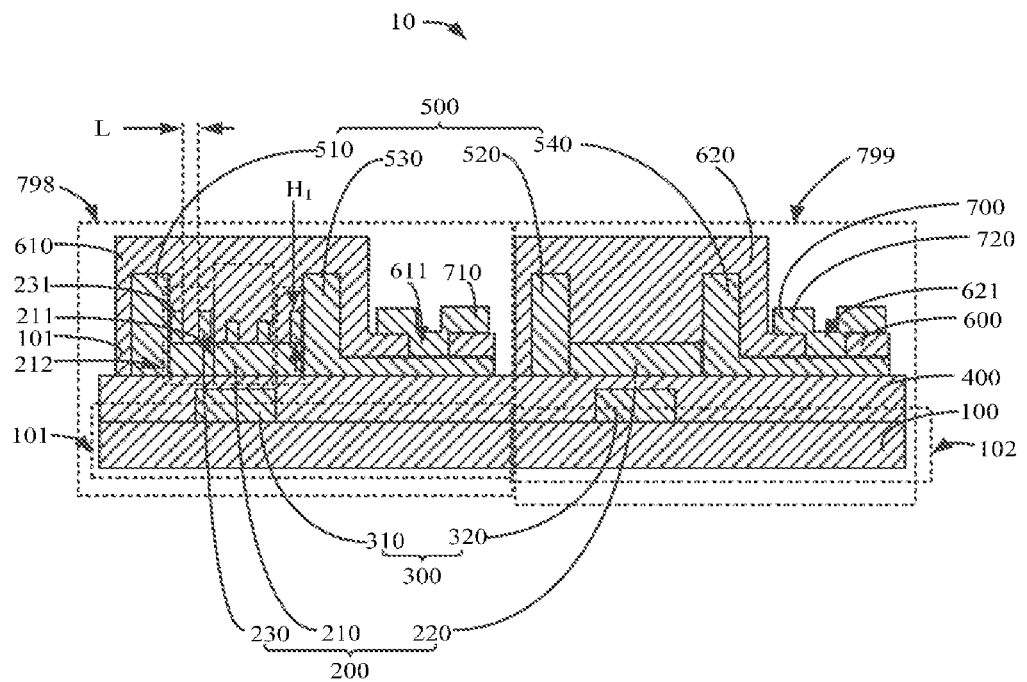
FIG. 5 is a schematic cross-sectional view of a fifth structure of a display device provided by an embodiment of the present disclosure.

Please refer to FIG. 5. FIG. 5 is a schematic cross-sectional view of a fifth structure of the display device according to an embodiment of the present disclosure. It should be noted that the difference between the fifth structure and the fourth structure is described as follows.

The additional portion 230 is disposed in the first active area 211 and the second active area 212. The thickness $H_1$ of the first additional sub-portion 231 of the second active area 212 is greater than the thickness $H_1$ of the first additional sub-portion 231 of the first active area 211.

In an embodiment, the thickness $H_1$ of each of the first additional sub-portions 231 disposed in the first active area 211 may not be equal. For example, in the first active area 211, the thicknesses $H_1$ of the adjacent first additional sub-portions 231 are not equal.

In the present disclosure, the thickness $H_1$ of the first additional sub-portion 231 in the second active area 212 is configured to be greater than the thickness $H_1$ of the first additional sub-portion 231 in the first active area 211, prolonging light transmitting through the first additional sub-portion 231, thereby further improving absorption of light, further improving signal intensity generated during laser irradiation, and improving performance of the display device 10. The thickness $H_1$ of each of the first additional sub-portion 231 in the first active area 211 is configured to be unequal, so that light propagates between the first additional sub-portions 231 in the first active area 211. The light not entering the first additional sub-portions 231 in the first active area 211 is blocked by the first additional sub-portions 231 in the second active area 212, so that light returns to the first additional sub-portions 231 in the first active area 211, thereby further prolonging light transmitting through the first additional sub-portions 231, further improving absorption of light, further increasing signal intensity generated during laser irradiation, and improving performance of the display device 10.

Please refer to FIG. 6. FIG. 6 is a schematic cross-sectional view of a fifth structure of the display device according to an embodiment of the present disclosure. It should be noted that the difference between the sixth structure and the first structure is described as following.

The display device 10 further includes a lower polarizer 20, a buffer layer 30, a color resist layer 40, a plurality of black matrix layers 50, a first alignment layer 60, a liquid crystal layer 70, a second alignment layer 80, a cover substrate 90, and an upper polarizer 99. The substrate layer 100 is disposed on the lower polarizer 20. The display transistor 799 and the photosensitive transistor 798 are disposed on the substrate layer 100. The buffer layer 30 covers the display transistor 799 and the photosensitive transistor 798. The plurality of black matrix layers 50 are arranged in array on the buffer layer 30. The color resist layer 40 is disposed between the plurality of black matrix layers 50. The color resist layer 40 includes a red color resist portion, a green color resist portion, and a blue color resist portion. The cover substrate 90 is aligned with the plurality of black matrix layers 50. The liquid crystal layer 70 is disposed between the cover substrate 90 and the plurality of black matrix layers 50. The liquid crystal layer 70 further includes a supporting wall 71. The supporting wall 71 is disposed to penetrate through the liquid crystal layer 70. The supporting wall 71 is used to support the liquid crystal layer 70, so as to prevent the liquid crystal layer 70 from being squeezed or damaged during the subsequent manufacturing process or use process. The first alignment layer 60 is disposed between the plurality of black matrix layers 50 and the liquid crystal layer 70. The second alignment layer 80 is disposed between the cover substrate 90 and the liquid crystal layer 70. The upper polarizer 99 is disposed on a side of the cover substrate 90 away from the liquid crystal layer 70.

Please refer to FIG. 7 and FIGS. 8 to 16. FIG. 7 is a schematic flowchart of a method of manufacturing a display device according to an embodiment of the present disclosure. FIGS. 8 to 16 are schematic cross-sectional views for the flowchart of the method of manufacturing the display device provided by the embodiment of the present disclosure. The present disclosure further provides a method of manufacturing the display device. The specific description is as follows.

Step B11, providing a substrate layer. The substrate layer includes a first substrate area and a second substrate area disposed adjacent to the first substrate area.

Figure 8:
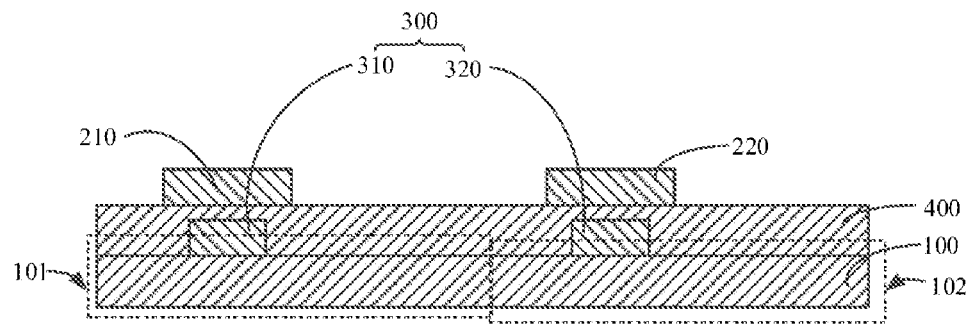
FIGS. 8 to 16 are schematic cross-sectional views for the flowchart of the method of manufacturing the display device provided by the embodiment of the present disclosure.

Please refer to FIG. 8. Material of the substrate layer 100 includes polyimide or the like.

After the step B11, the method further includes the following steps.

Providing material of the gate layer 300 on the substrate layer 100 to form the gate layer 300 by etching. Material of the gate layer 300 includes one or several combinations of Al, Cu, Ag, Au, Mn, Zn, and Fe. The gate layer 300 includes a first gate portion 310 and a second gate portion 320. The first gate portion 310 is located on the first substrate area 101. The second gate portion 320 is located on the second substrate area 102.

After the step of providing material of the gate layer 300 on the substrate layer 100 to form the gate layer 300 by etching, the method further includes the following steps.

Providing material of the first insulating layer 400 on the substrate layer 100 and the gate layer 300 to form the first insulating layer 400. Material of the first insulating layer 400 includes one or several combinations of $SiN_x$, $SiO_x$, and $SiO_xN_y$.

Step B12, forming an active layer on the substrate layer. The active layer includes a first body portion, a second body portion, and an additional portion. The first body portion is disposed on the first substrate area, the additional portion is disposed on the first body portion, the second body portion is disposed on the second substrate area, and the first body portion and the additional portion are not connected to the second body portion. A band gap of the additional portion is smaller than a band gap of the first body portion and a band gap the second body portion.

Figure 9:
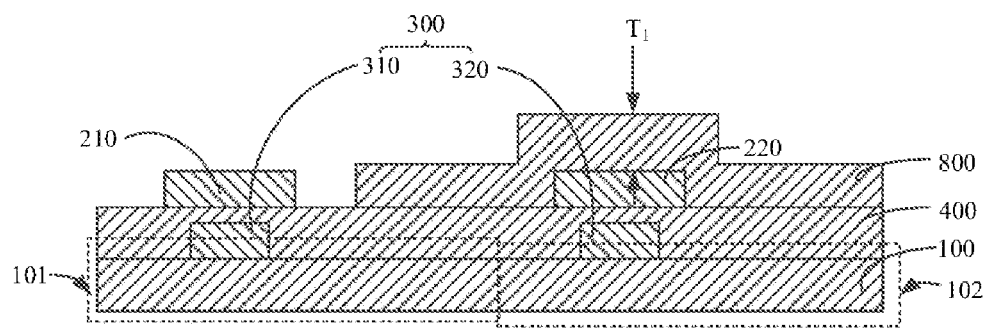

Please refer to FIG. 9. Specifically, materials of the first body portion 210 and the second body portion 220 are provided on the first insulating layer 400, so as to form the first body portion 210 and the second body portion 220 by etching. The first body portion 210 is located on the first gate portion 310. The second body portion 220 is located on the second gate portion 320. The first body portion 210 is not connected to the second body portion 220.

In an embodiment, the band gaps of the first body portion 210 and the second body portion 220 range greater than 3.5 electron volts (eV).

In an embodiment, materials of the first body portion 210 and the second body portion 220 include indium gallium zinc oxide (IGZO).

Then, a first protective layer 800 is formed on the substrate layer 100 and the second body portion 220. Specifically, material of the first protective layer 800 is provided on the first insulating layer 400, the first body portion 210, and the second body portion 220, and the first protective layer 800 is formed by etching. The first protective layer 800 covers the second body portion 220. The first protective layer 800 is a photoresist layer. A thickness $T_1$ of the first protective layer 800 ranges from 1000 nanometers to 10,000 nanometers. Specifically, the thickness $T_1$ of the first protective layer 800 may be 2000 nanometers, 3800 nanometers, 5800 nanometers, 7000 nanometers, 8900 nanometers, 9500 nanometers, or the like.

Figure 10:
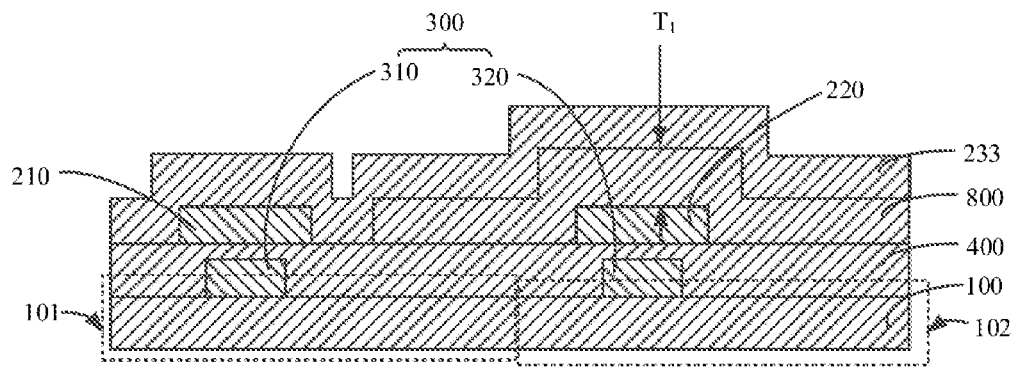

Please refer to FIG. 10. Then, material of the additional portion 230 is provided on the first body portion 210 and the first protective layer 800 to form a first prefabricated additional portion 233.

In an embodiment, a band gap of the additional portion 230 ranges from 1 eV to 3.5 eV.

In an embodiment, material of the additional portion 230 includes one or several combinations of $Hg_{1-x}Cd_xSe$, $Mn_xHg_{1-x}Te$, $Pb_{1-x}Sn_xTe$, $Pb_{1-x}Sn_xSe$, ZnO, and ZnON, wherein $0 \leq x \leq 1$.

Figure 11:
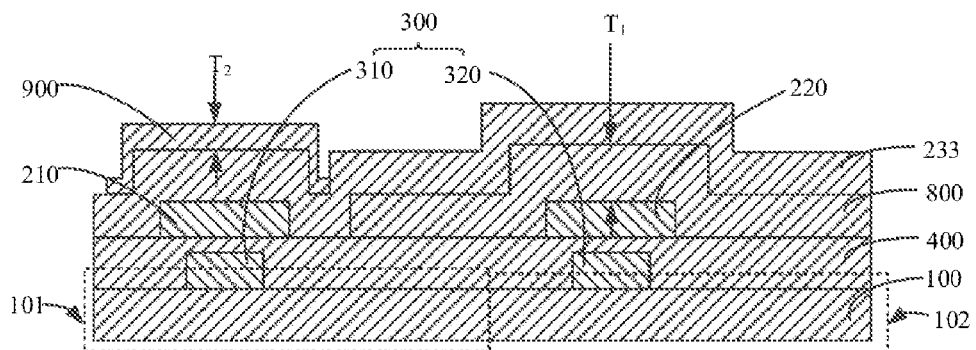

Please refer to FIG. 11. Then, material of the second protective layer 900 is provided on the additional portion 230 on the first body portion 210, so as to form the second protective layer 900 by etching. The second protective layer 900 is a photoresist layer. A thickness $T_2$ of the second protective layer 900 is smaller than the thickness $T_1$ of the first protective layer 800.

In an embodiment, the thickness $T_1$ of the first protective layer 800 is at least 1000 nanometers thicker than the thickness $T_2$ of the second protective layer 900.

In the present disclosure, the thickness $T_2$ of the second protective layer 900 is defined to be smaller than the thickness $T_1$ of the first protective layer 800, so as to prevent all the first protective layer 800 from being peeled when the second protective layer 900 is peeled by a peeling solution in the subsequent manufacturing process, thereby preventing the second body portion 220 from being damaged in the subsequent manufacturing process and ensuring performance of the display device 10.

In an embodiment, the thickness $T_2$ of the second protective layer 900 ranges from 20 nanometers to 9000 nanometers. Specifically, the thickness $T_2$ of the second protective layer 900 may be 200 nanometers, 2500 nanometers, 4000 nanometers, 5600 nanometers, 8000 nanometers, or the like.

Figure 12:
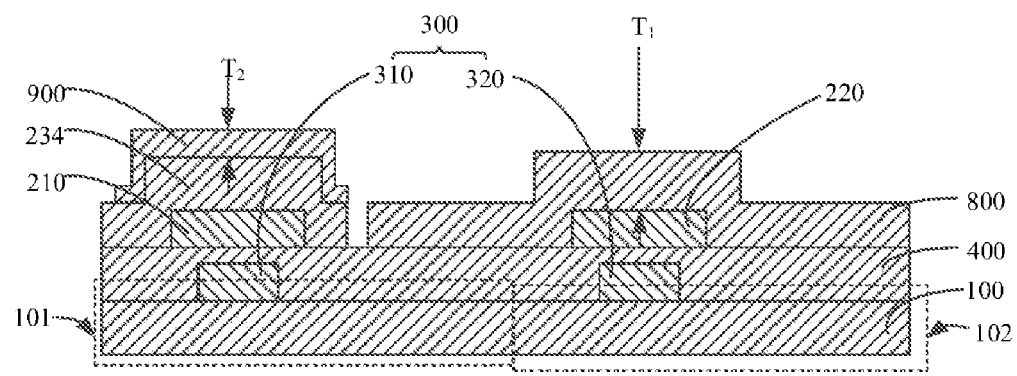

Please refer to FIG. 12. Then, the first prefabricated additional portion 233 is etched with an acid etching solution to form a second prefabricated additional portion 234. The acid etching solution includes one or several combinations of $HNO_3$, $HCl$, and $H_2SO_4$.

Figure 13:
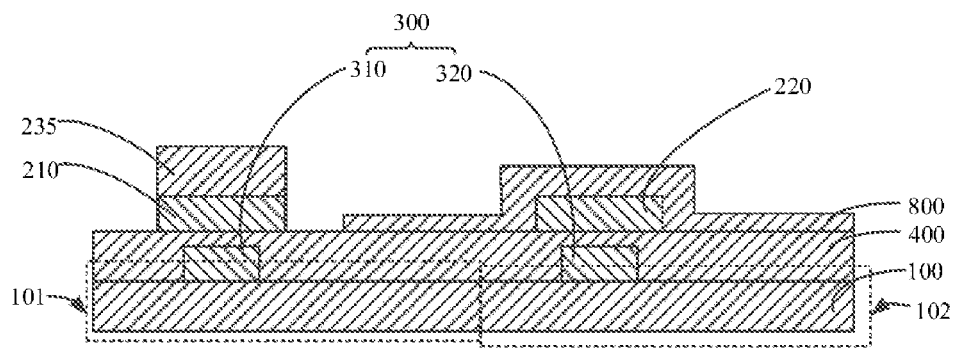

Please refer to FIG. 13. Then, the first protective layer 800 and the second protective layer 900 are treated with a peeling solution, and the second prefabricated additional portion 234 forms a third prefabricated additional portion 235. Moreover, the second protective layer 900 is completely peeled, the thickness of the first protective layer 800 is reduced, and both ends of the first body portion 210 and the third prefabricated additional portion 235 are exposed.

Figure 14:
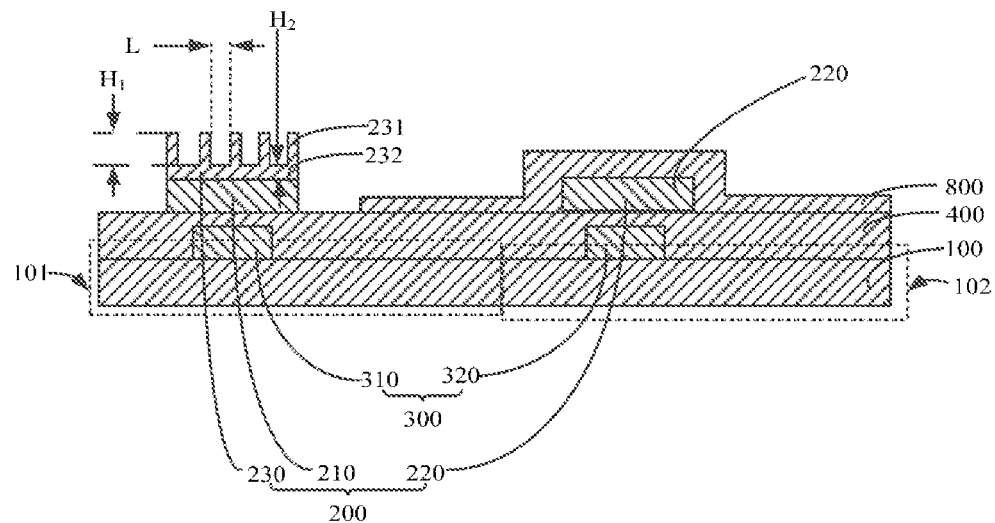

Please refer to FIG. 14. Then, the third prefabricated additional portion 235 is etched by an acid etching solution to form the additional portion 230. The additional portion 230 includes a first additional sub-portion 231 and a second additional sub-portion 232. The second additional sub-portion 232 is disposed on the first body portion 210. The first additional sub-portion 231 is disposed on the second additional sub-portion 232.

The first body portion 210, the second body portion 220, and the additional portion 230 constitute the active layer 200 of the display device 10.

Figure 15:
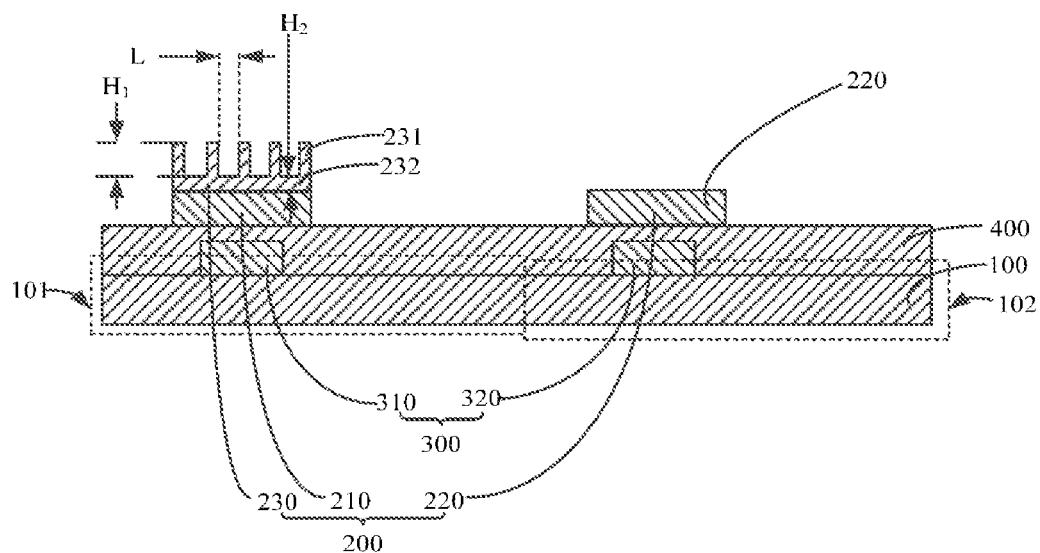

Please refer to FIG. 15. Then, the first protective layer 800 is treated with a peeling solution, and the first protective layer 800 is peeled.

After the step of treating the first protective layer 800 with a peeling solution and peeling the first protective layer 800, the method further includes the following steps.

Figure 16:
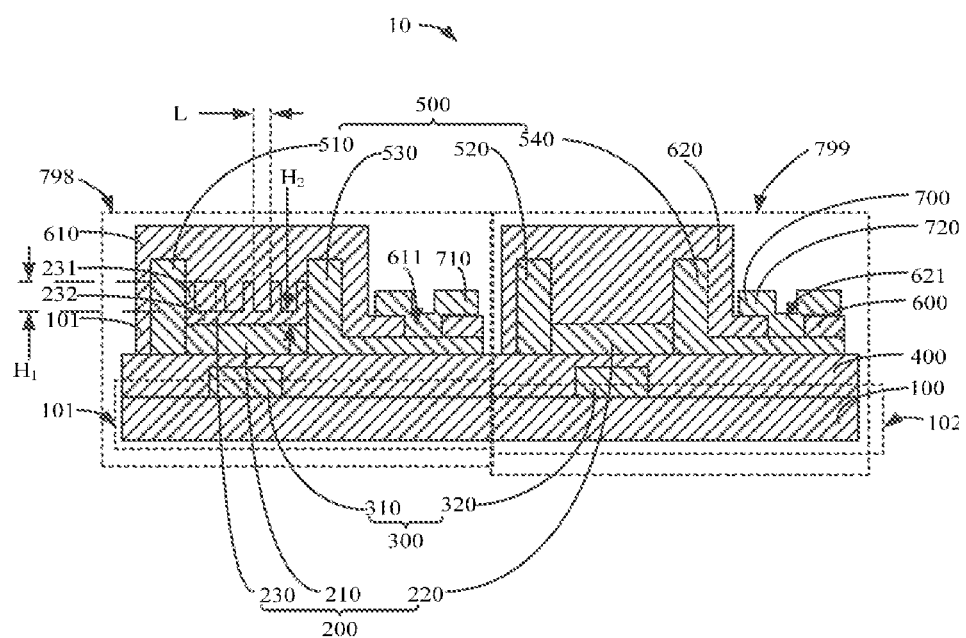

Please refer to FIG. 16. Material of the source and drain layer 500 is provided on the first insulating layer 400 and the active layer 200 to form the source and drain layer 500. Material of the source and drain layer 500 includes one or several combinations of Al, Cu, Ag, Au, Mn, Zn, and Fe. The source and drain layer 500 includes a first source 510, a second source 520, a first drain 530, and a second drain 540. The first source 510 is located on one side of the first body portion 210 and the additional portion 230. The first drain 530 is located on the other side of the first body portion 210 and the additional portion 230. The second source 520 is located on one side of the second body portion 220. The second drain 540 is located on the other side of the second body portion 220.

After the step of providing the material of the source and drain layer 500 on the first insulating layer 400 and the active layer 200 to form the source and drain layer 500, the method further includes the following steps.

Material of the second insulating layer 600 is provided on the additional portion 230 and the source and drain layer 500 to form the second insulating layer 600 by etching. Material of the second insulating layer 600 includes one or several combinations of $SiN_x$, $SiO_x$, and $SiO_xN_y$. The second insulating layer 600 includes a first insulating portion 610 and a second insulating portion 620. The first insulating portion 610 covers the additional portion 230, the first source 510, and the first drain 530. The first insulating portion 610 includes a first through hole 611. The first through hole 611 penetrates the first insulating portion 610 to expose the first drain 530. The second insulating portion 620 covers the second body portion 220, the second source 520 and the second drain 540. The second insulating portion 620 includes a second through hole 621. The second through hole 621 penetrates the second insulating portion 620 to expose the second drain electrode 540.

After providing the material of the second insulating layer 600 on the additional portion 230 and the source and drain layer 500 and forming the second insulating layer 600 by etching, the method further includes the following steps.

Forming a conductive layer 700 on the second insulating layer 600. The conductive layer 700 includes a first conductive portion 710 and a second conductive portion 720. The first conductive portion 710 is disposed on the first insulating portion 610 and extends into the first through hole 611 to be electrically connected to the first drain 530. The second conductive portion 720 is disposed on the second insulating portion 620 and extends into the second through hole 621 to be electrically connected to the second drain 540.

The first gate portion 310, the first body portion 210, the additional portion 230, the first source 510, the first drain 530, the first insulating portion 610, and the first conductive portion 710 constitute the photosensitive transistor 798. The second gate portion 320, the second body portion 220, the second source 520, the second drain 540, the second insulating portion 620, and the second conductive portion 720 constitute the display transistor 799.

The embodiment of the present disclosure discloses a display device and a method of manufacturing the same. The display device includes a substrate layer and an active layer. The substrate layer includes a first substrate area and a second substrate area adjacent to the first substrate area. The active layer includes a first body portion, a second body portion, and an additional portion, wherein the first body portion is disposed on the first substrate area, and the additional portion is disposed on the first body portion, the second body portion is disposed on the second substrate area, the first body portion and the additional portion are not connected to the second body portion, and the band gap of the additional portion is smaller than that of the band gap of the first body portion and that of the second body portion. By providing the additional portion with the band gap smaller than that of the first body portion and that of the second body portion on the first body portion, the band gap of the active layer is reduced, thereby increasing photosensitive performance of the active layer, increasing signal intensity generated by the active layer, and improving performance of the display device.

The display device and the method of manufacturing the same provided by the embodiment of the present disclosure are described in detail above. Specific examples are applied to describe the principle and implementation mode of the present disclosure herein. The description of the above embodiment is only used to help understand the method and core idea of the present disclosure. In addition, for those skilled in the art, there will be modifications in the specific implementation mode and application scope according to the idea of the present disclosure. As mentioned above, the content of the specification should not be understood as a restriction on the present disclosure.

What is claimed is:

1. A display device, comprising:
   a substrate layer, including a first substrate area and a second substrate area adjacent to the first substrate area;
   a gate layer disposed on the substrate layer, wherein the gate layer includes a first gate portion and a second gate portion, the first gate portion is located on the first substrate area, and the second gate portion is located on the second substrate area; and
   an active layer including a first body portion, a second body portion, and an additional portion, wherein the first body portion is disposed in the first substrate area and on the first gate portion, the additional portion is disposed on the first body portion, the second body portion is disposed in the second substrate area and on the second gate portion, the first body portion and the additional portion are not connected with the second body portion, and a band gap of the additional portion is smaller than a band gap of the first body portion and a band gap of the second body portion,
   wherein the additional portion includes a plurality of first additional sub-portions, and each adjacent two of the first additional sub-portions are not connected with each other.

2. The display device of claim 1, wherein the additional portion further includes a second additional sub-portion, the second additional sub-portion is disposed on the first body portion, and the plurality of first additional sub-portions are disposed on the second additional sub-portion.

3. The display device of claim 1, wherein a surface of each of the first additional sub-portions defines a first microstructure.

4. The display device of claim 1, wherein the first body portion includes a first active area and a second active area disposed around the first active area, and the plurality of first additional sub-portions are disposed in the second active area.

5. The display device of claim 1, wherein the first body portion includes a first active area and a second active area disposed around the first active area, the first additional sub-portions are disposed in the first active area and the second active area, and a thickness of the first additional sub-portion in the second active area is greater than a thickness of the first additional sub-portion in the first active area.

6. The display device of claim 1, wherein the display device further comprises a first insulating layer, and the first insulating layer covers the substrate layer and the gate layer.

7. The display device of claim 1, wherein a distance between each adjacent two of the first additional sub-portions ranges from 1 nanometer to 5000 nanometers.

8. A display device, comprising:
   a substrate layer including a first substrate area and a second substrate area adjacent to the first substrate area; and
   an active layer including a first body portion, a second body portion, and an additional portion, wherein the first body portion is disposed in the first substrate area, the additional portion is disposed on the first body portion, the second body portion is disposed in the second substrate area, the first body portion and the additional portion are not connected with the second body portion, and a band gap of the additional portion is smaller than a band gap of the first body portion and a band gap of the second body portion,
   wherein the additional portion includes a plurality of first additional sub-portions, and each adjacent two of the first additional sub-portions are not connected with each other.

9. The display device of claim 8, wherein the additional portion further includes a second additional sub-portion, the second additional sub-portion is disposed on the first body portion, and the plurality of first additional sub-portions are disposed on the second additional sub-portion.

10. The display device of claim 8, wherein a surface of each of the first additional sub-portions defines a first microstructure.

11. The display device of claim 8, wherein the first body portion includes a first active area and a second active area disposed around the first active area, and the plurality of first additional sub-portions are disposed in the second active area.

12. The display device of claim 8, wherein the first body portion includes a first active area and a second active area disposed around the first active area, the plurality of first additional sub-portions are disposed in the first active area and the second active area, and a thickness of the first additional sub-portion in the second active area is greater than a thickness of the first additional sub-portion in the first active area.

13. The display device of claim 8, wherein the display device further comprises a first insulating layer, and the first insulating layer covers the substrate layer and the gate layer.

14. The display device of claim 8, wherein a distance between each adjacent two of the first additional sub-portions ranges from 1 nanometer to 5000 nanometers.

15. A method of manufacturing a display device, comprising steps of:
   providing a substrate layer, wherein the substrate layer includes a first substrate area and a second substrate area adjacent to the first substrate area; and
   forming an active layer on the substrate layer, wherein the active layer includes a first body portion, a second body portion, and an additional portion, the first body portion is disposed in the first substrate area, the additional portion is disposed on the first body portion, the second body portion is disposed in the second substrate area, the first body portion and the additional portion are not connected with the second body portion, and a band gap of the additional portion is smaller than a band gap of the first body portion and a band gap of the second body portion,
   wherein the additional portion includes a plurality of first additional sub-portions, and each adjacent two of the first additional sub-portions are not connected with each other.

16. The method of manufacturing the display device of claim 15, wherein the step of forming the active layer on the substrate layer includes steps of:
   forming a first protective layer on the substrate layer and the second body portion;
   providing an additional portion material on the first body portion;
   forming a second protective layer on the additional portion material on the first body portion; and
   etching the additional portion material to form an additional portion, wherein the first body portion, the second body portion, and the additional portion constitute the active layer.

17. The method of manufacturing the display device of claim 16, wherein the step of etching the additional portion material to form the additional portion includes: removing the second protective layer.

18. The method of manufacturing the display device of claim 17, wherein after the step of removing the second protective layer, the method further includes a step of etching the additional portion to form an additional portion including the plurality of first additional sub-portions and a second additional sub-portion, wherein the second additional sub-portion is disposed on the first body portion, and the plurality of first additional sub-portions are disposed on the second additional sub-portion.

19. The method of manufacturing the display device of claim 15, wherein after the step of providing the substrate layer including the first substrate area and the second substrate area adjacent to the first substrate area, before the step of forming the active layer on the substrate layer, the method further comprises a step of forming a gate layer on the substrate layer, wherein the gate layer includes a first gate portion and a second gate portion, the first gate portion is located in the first substrate area, and the second gate portion is located in the second substrate area.

20. The method of manufacturing the display device of claim 15, wherein a distance between each adjacent two of the first additional sub-portions ranges from 1 nanometer to 5000 nanometers.

\* \* \* \* \*